United States Patent [19]

Pace

[11] Patent Number: 4,590,394

[45] Date of Patent: May 20, 1986

[54] SIGNAL PROCESSING CIRCUIT WITH VOLTAGE CLAMPED INPUT

[75] Inventor: Gary L. Pace, Ft. Lauderdale, Fla.

[73] Assignee: Motorola, Inc., Schaumburg, Ill.

[21] Appl. No.: 589,269

[22] Filed: Mar. 13, 1984

[51] Int. Cl.$^4$ .............................................. H03K 5/08
[52] U.S. Cl. ................................... 307/549; 307/362; 307/494; 307/555; 307/558
[58] Field of Search ............... 307/362, 494, 540, 542, 307/546, 547, 549, 555, 557, 558, 567; 328/168, 169, 171, 172, 173

[56] References Cited

U.S. PATENT DOCUMENTS

| | | |
|---|---|---|
| 2,493,045 | 1/1950 | Toth . |
| 3,085,131 | 4/1963 | Diehl . |
| 3,102,237 | 8/1963 | Elliot . |
| 3,164,773 | 1/1965 | Daniel . |
| 3,437,836 | 4/1969 | Hull ................................... 307/494 |
| 3,555,438 | 1/1971 | Ragsdales . |
| 3,571,620 | 3/1971 | Hansen et al. . |
| 4,042,883 | 8/1977 | Rae . |
| 4,114,097 | 9/1978 | Kubo et al. . |
| 4,185,246 | 1/1980 | Schroeder . |
| 4,263,565 | 4/1981 | Astle . |
| 4,271,535 | 6/1981 | Fukuhara et al. . |
| 4,274,132 | 6/1981 | Molyneoux-Berry . |
| 4,380,832 | 4/1983 | Nagata et al. . |
| 4,382,198 | 5/1983 | Ishijima et al. ................... 307/555 |

OTHER PUBLICATIONS

National Semiconductor AN-29 "IC OP AMP Beats Fets on Input Current", Dec. 1969, pp. 1–19.

Primary Examiner—John Zazworsky
Attorney, Agent, or Firm—Martin J. McKinley; Joseph T. Downey; Edward M. Roney

[57] ABSTRACT

A signal processing circuit with enhanced response time includes a data limiter circuit having an input and an input capacitor having one terminal coupled to the input. A first selectively actuable voltage clamping circuit responds to a first comparing circuit and is coupled to the input for preventing the voltage at the input from exceeding a predetermined upper voltage. A second selectively actuable voltage clamping circuit is responsive to a second comparing circuit and is coupled to the input for preventing the voltage at the input from decreasing below a predetermined lower voltage.

15 Claims, 6 Drawing Figures

SIGNAL PROCESSING CIRCUIT WITH VOLTAGE CLAMPED INPUT

BACKGROUND OF THE INVENTION

1. Field of the Invention

The present invention relates to an FM receiver for receiving FSK binary signals and more particularly to a signal processing circuit such as a data limiter with a capacitively coupled voltage clamped input for exhibiting fast response time in the presence of input disturbances.

2. Background of the Invention

A block diagram of a prior art FM receiver system suitable for use in a synchronous paging system is illustrated in FIG. 1. The receiver comprises the antenna 10 which receives an RF signal and transmits it to a receiver 12 where the RF signal is amplified and converted into a first intermediate frequency (IF) signal by an RF amplifier and first mixer, respectively. This IF signal is preferably directed to the receiver's back end where the first IF signal is converted to a second IF signal (in a dual conversion receiver) amplified, limited, filtered and demodulated. The voltage level of the output signal at output 14 represents the coded binary data. Output 14 may of course be viewed as having a Thevenin equivalent of a voltage source in series with an output resistance which is not shown. The output 14 of the receiver 12 is capacitively coupled to the input 15 of a data limiter 16 via a coupling capacitor 18. Internal or external limiter bias resistors (not shown) are normally used to bias the data limiter 16. The output of the data limiter 16 is directed to a data processor 20 for further desired processing.

The FM receiver system also includes one or more switches 22 (normally transistors) connected between the various components of the FM receiver system and the power supply. This switch is periodically turned ON and OFF by battery saver circuit 24 to provide a battery saving feature, which is a technique well known to those skilled in the art. A switch 26 (also, normally a transistor) is periodically closed to precharge the coupling capacitor 18, preferably by placing a resistor 27 in parallel with the limiter bias resistors and input impedance thereby reducing the overall RC time constant. Switch 26 is normally closed simultaneously with the switch 22 but normally remains closed for a shorter time than switch 22 to provide this precharging feature.

Normally, in situations where it is necessary to pass digital data from the receiver 12 to the data limiter 16, capacitor 18 will be a relatively large value in order to pass the low frequency information in digital signals. Thus, a long time may be required to charge the capacitor 18, especially when it is connected to a high impedance such as the limiter bias resistors for the data limiter 16. A long charge time necessitates that receiver "ON" time be increased correspondingly to ensure that capacitor 18 is charged to its correct bias point and that valid data is delivered to the data processor 20 during the data decoding interval. The battery saver feature is clearly degraded by the extended receiver "ON" time since this consumes more battery energy than is desirable. The switch 26 is used to alleviate this situation by providing a momentary low impedance charge path in parallel with the data limiter's bias resistors immediately upon receipt of power from the battery saver 24, that is, when the switch 22 is closed. This allows capacitor 18 to more rapidly charge to a voltage dependent upon the average value of the incoming data. If the incoming data can be depended upon to have no long strings of ones or zeros the charging of capacitor 18 will closely approximate the desired bias voltage. Data decoding of the received bit stream can begin more rapidly and continue until the battery voltage B+ is again removed by switch 22, thereby enhancing the battery saver feature.

However, one problem still exists even when the coupling capacitor 18 is precharged. Under ideal conditions (an alternating one-zero data pattern) the average voltage level at the output of the receiver 12 will be at the desired carrier reference voltage, that is the voltage level which corresponds to an undeviated RF carrier signal. During the precharge interval, capacitor 18 will charge to a bias voltage which is consistent with this carrier reference voltage and proper data decoding will occur. If a long string of ones or zeros is received immediately before the opening of switch 26 the average DC voltage at the receiver output 14 will be offset from the desired reference. The average DC voltage is increased if a large number of ones are received or decreased if a large number of zeros are received.

Thus, relatively substantial DC voltage offsets from the correct bias voltage across capacitor 18 may still occur if this technique is used in an asynchronous system with unpredictable data patterns. This may result in erroneous outputs from the data limiter 16, long response time (the delay required between receipt of a signal and occurrence of valid data at the limiter output), and may ultimately result in the end user receiving no message or an erroneous message which differs from the originally transmitted message.

SUMMARY OF THE INVENTION

It is an object of the present invention to provide an improved signal processing circuit such as a data limiter with voltage clamped input.

It is another object of the present invention to provide a data limiter with enhanced response time.

It is another object of the present invention to provide a data limiter with enhanced response time which is suitable for use in either battery saver or non-battery saver receivers.

It is a further object of the present invention to provide a data limiter with voltage clamped input for fast response time suitable for use in battery saver receiver systems.

These and other objects of the present invention will become apparent to those skilled in the art upon consideration of the following description of the invention.

According to one embodiment of the present invention, a signal processing arrangement for reducing data errors due to excess bias offset and with enhancing response time when input signals are capacitively coupled to its input includes a first voltage comparing circuit for comparing the input signal with the reference voltage and providing a first output signal when the input signal exceeds the reference voltage by a first predetermined voltage. A first voltage clamp circuit is coupled to the input and prevents the voltage at the input from exceeding the reference voltage by more than the first predetermined voltage. A second voltage comparing circuit compares the input signal with the reference voltage and provides a second output signal when the input signal decreases below the reference voltage by a second predetermined voltage. A second voltage clamping circuit prevents the voltage at the input from decreasing below the reference voltage by more than the second predetermined voltage. Preferrably, the first and second voltage comparing circuits are selectively actuable by a battery saver control circuit.

The features of the invention believed to be novel are set forth with particularity in the appended claims. The invention itself, however both as to organization and method of operation, together with further objects and advantages thereof, may be best understood by reference to the following description taken in conjunction with the accompanying drawings.

DETAILED DESCRIPTION OF THE PREFERRED EMBODIMENT

Figure 1:
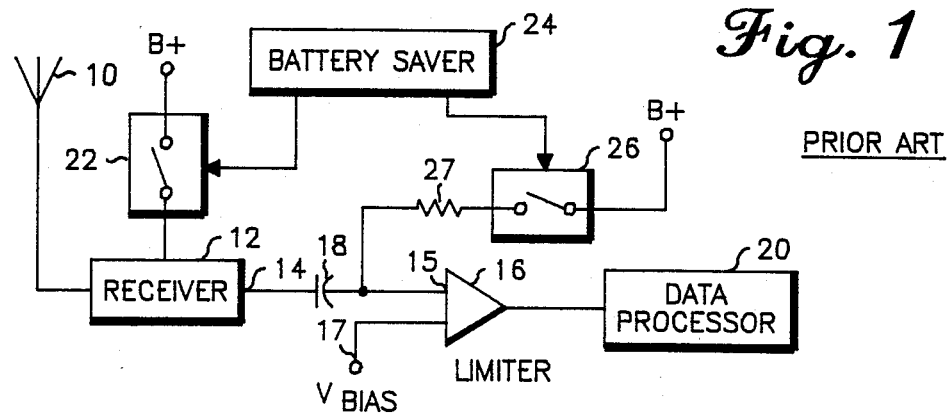
FIG. 1 shows a battery saver receiver system utilizing a precharging technique to enhance response time.
Figure 2:
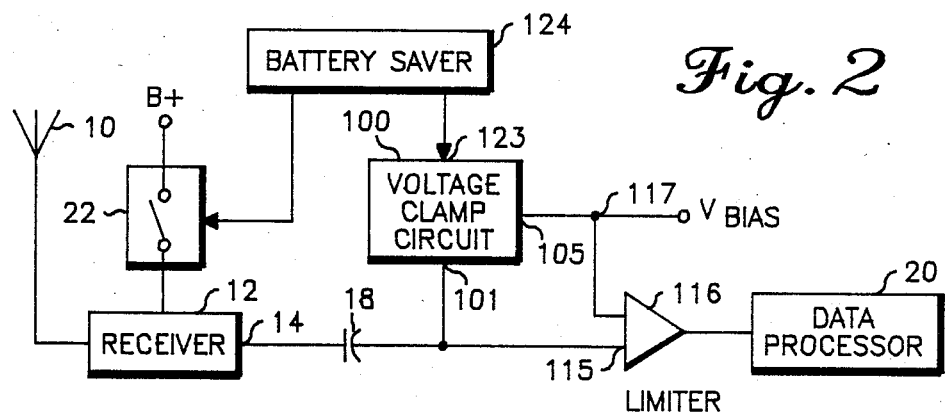
FIG. 2 shows a battery saver implementation of the present invention.

Turning now to FIG. 2, a battery saver implementation of the present invention is shown. Once again antenna 10 provides receiver 12 with an input signal which is ultimately converted to a demodulated signal at receiver output 14 and delivered to capacitor 18. In the present embodiment, an F.M. receiver for receiving FSK binary data is preferred, but this is not to be limiting. A voltage clamp circuit 100 is coupled at its terminal 101 to the other terminal of capacitor 18 and also to an input 115 of data limiter 116. Terminal 105 of voltage clamp circuit 100 is coupled to input terminal 117 of limiter 116, which is also coupled to the limiter's bias source labeled $V_{BIAS}$ to establish the limiter's threshold voltage. A control input 123 of clamp circuit 100 is coupled to a battery saver circuit 124. Battery saver circuit 124 also serves as a control circuit which controls switch 22 to effect normal battery saver operation. The output of limiter 116 drives data processor 20. While the present invention is preferably practiced in conjunction with a data limiter, it will be clear that the voltage clamp arrangement may be useful for other types of signal processing arrangements.

In operation, voltage clamp circuit 100 examines the input voltage of the limiter at terminal 115 and compares that to the reference voltage at terminal 117 which is the limiter threshold voltage. It then determines what effect the incoming data, which is charging and discharging capacitor 18, and what effect the switching of switch 22 during battery saver operation, is having upon the voltage at the input 115 of limiter 116. If it is determined that the input voltage has reached a predetermined maximum acceptable upward deviation from the limiter threshold voltage, voltage clamp circuit 100 clamps the input voltage at terminal 115 at this predetermined maximum level.

If on the other hand, it is determined that the input voltage has reached a predetermined maximum acceptable downward deviation from the limiter threshold level, voltage clamp circuit 100 clamps the voltage at node 115 at this predetermined lower limit. In this manner, capacitor 18, is maintained at an appropriate charge to properly deliver data to limiter 116 for processing. This prevents slow response time and excessive data errors. Of course, it is clear that at least one of the upward and downward deviations must be greater than zero volts.

For the battery saver systems of FIG. 2, it may be desirable to only actuate the voltage clamp circuit by providing an appropriate signal at control input 123, for the first few moments of the battery saver cycle, thereby forcing a rapid charge of capacitor 18. Or, it may be preferrable to have voltage clamp circuit 100 actuated for the entire battery saver cycle, i.e. voltage clamp circuit 100 would be actuated whenever switch 22 is closed.

The RC time constant associated with capacitor 18 when voltage clamp circuit 100 is not actuated is clearly determined primarily by the Thevenin resistance at the output of receiver 12 in series with the input resistance of limiter 116. This time constant should preferrably be chosen to allow the lowest conceivable frequencies of data information to pass. When the clamp circuit is actuated and when the voltage at the input 115 of limiter 116 reaches either limiter voltage, the input impedance of the limiter is shunted thereby significantly reducing the time constant. One data bit period has been found suitable for the shorter time constant.

Figure 3:
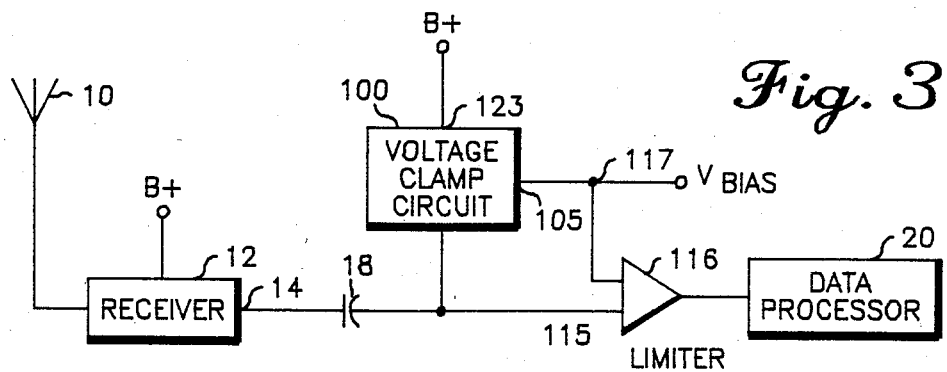
FIG. 3 shows an embodiment of the present invention implemented in a non-battery saver system.

One advantage of the present arrangement is that it can be utilized in non-battery saver receiver systems. Such an implementation is shown in FIG. 3 wherein receiver 12 is continously actuated as is voltage clamp circuit 100. While in the preferred embodiment, voltage clamp circuit 100 would be actuated by a high signal level at control input 123 such as B+, those skilled in the art will readily recognize that other embodiments may be equally functional.

Figure 4:
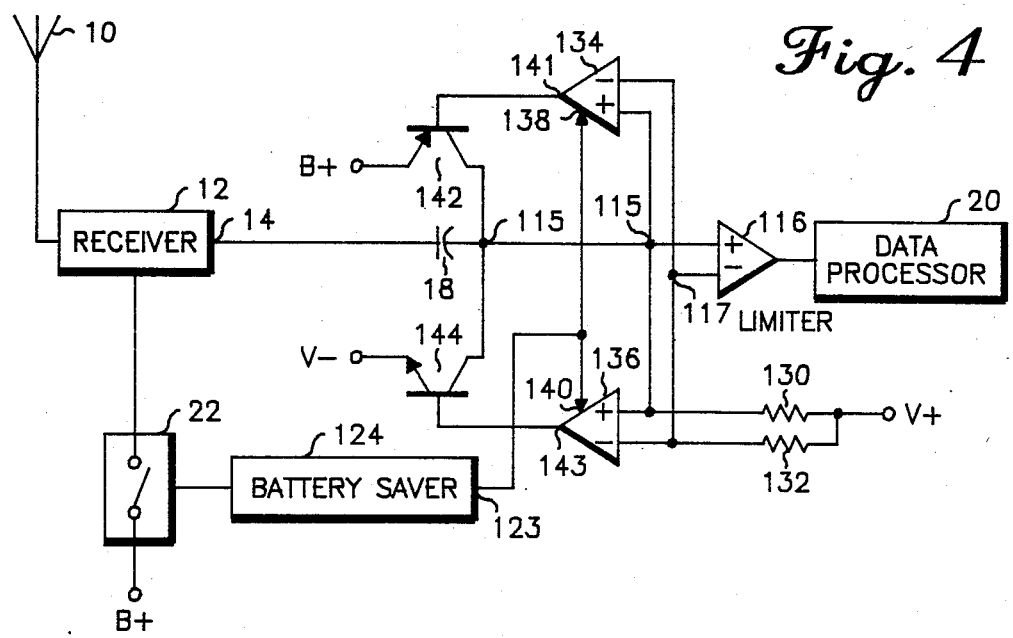
FIG. 4 is a more detailed schematic of the present invention.

Turning now to FIG. 4, a more detailed representation of the present invention is shown. According to this embodiment, bias voltage V+ is supplied to limiter 116 through a pair of bias resistors 130 and 132 to establish the limiter threshold, but this is not to be limiting. A first transconductance amplifier 134 serves as a comparing circuit and has its positive input coupled to terminal 115 and its negative input coupled to terminal 117. A second transconductance amplifier 136 serves as a comparing circuit and is similarly connected. Transconductance amplifiers 134 and 136 are preferably selectively actuable by applying a high logic level at terminals 138 and 140 respectively. The junction of terminals 138 and 140 forms control input 123 to be driven by battery saver circuit 124.

Transconductance amplifers 134 and 136 serve to compare the input voltage at terminal 115 with the reference voltage at terminal 117 and are preferably somewhat specialized for the present application. In order to begin a change in state at the output of amplifier 134, its inverting input must see a voltage level which is greater than the non-inverting input by a predetermined voltage. This predetermined voltage is the difference between the reference voltage level at the limiter input and the minimum permissible input voltage. Similarly, transconductance amplifier 136 begins changing output states when the non-inverting terminal is a predetermined voltage greater than the inverting terminal, wherein this predetermined voltage is the permissible differential between the reference voltage and the maximum acceptable input voltage. One embodiment for implementing such transconductance amplifiers will be discussed later.

The output 141 of transconductance amplifer 134 drives the base of a PNP transistor 142 which serves as a voltage clamp. The collector of transistor 142 is coupled to node 115 and the emitter of transistor 142 is coupled to a DC source B+ having a voltage level greater than a saturation voltage above the lower limit of the permissible input voltage at node 115. Similarly, an NPN transistor 144 serves as a voltage clamp and has its base driven by the output 143 of transconductance amplifier 136 and its collector coupled to node 115. The emitter of NPN transistor 144 is coupled to a DC voltage source V− having a voltage level which is less than one saturation voltage lower than the upper permissible input voltage at node 115. In the preferred embodiment transistors 142 and 144 are in a common emitter configuration, however, a common collector configuration may be successfully utilized for either or both, provided amplifiers 134 and 136 are reconfigured accordingly. Thus, when the input voltage at node 115 approaches the upper limit of permissible input voltage, transconductance amplifier 136 causes transistor 144 to begin to turn on, clamping the voltage at node 115 at its upper limit. Conversely, if the input voltage at node 115 drops to near the lower limit of permissible input voltages, transconductance amplifier 134 begins to turn on transistor 142 clamping the voltage at node 115 to its lower limit. In this manner, the voltage at node 115 is always within the upper and lower limit of permissible voltage.

In the preferred embodiment, the present invention is practiced in conjunction with a miniature paging receiver. Such paging receiver, typically operates on a single low voltage battery cell having an output voltage of approximately 1.3 volts. As such, B+ is preferrably approximately 1.3 volts. Accordingly, V+ may be approximately 1 volt and V− may be approximately 0.35 volts. The preferred input voltage at node 115 is centered around approximately 1.0 volts and the FM detector provides an output of approximately 100 millivolts peak to peak. In such a system it is desirable for the output of the FM detector to be reasonably consistent. In the preferred embodiment, it is desirable to maintain the voltage at node 115 within approximately 50 millivolts of its optimum input voltage so that the total acceptable range is about the same as the peak-to-peak output of the FM detector. As such, transconductance amplifiers 134 and 136 should experience a change in output when the voltage at node 115 attempts to deviate by more than approximately 50 millivolts from this optimum voltage. The circuits of FIGS. 5 and 6 show transconductance amplifiers which have approximately 54 millivolts of offset before an output transition takes place.

It should be noted that the input signals at terminal 115 will not likely appear as perfectly square, logic-like signals since the limiter's purpose is to transform them into appropriate logic signals. This is, of course, accomplished in the limiter by comparing the input with the reference voltage and making a logic decision based upon that comparison. If the amplitude of the input signal is substantially less peak-to-peak than the difference between the upper permissible input voltage and the lower permissible input voltage, and if a capacitor voltage offset error is created (by battery saver or other signal disturbance) then the non-ideal wave shape of the input signal, coupled with the offset error, will create a situation wherein substantial deviation from an ideal 50% duty cycle (in an alternating one-zero pattern) is likely. It is, therefore, desirable for the peak-to-peak amplitude of the input signal to be equal to or slightly less than the difference between the upper and lower permissible input levels. This causes clamp circuit 100 to operate only when a disturbance necessitates it and allows conventional operation otherwise. This, however, is not to be limiting since the circuit will also function with larger input signals.

Figure 5:
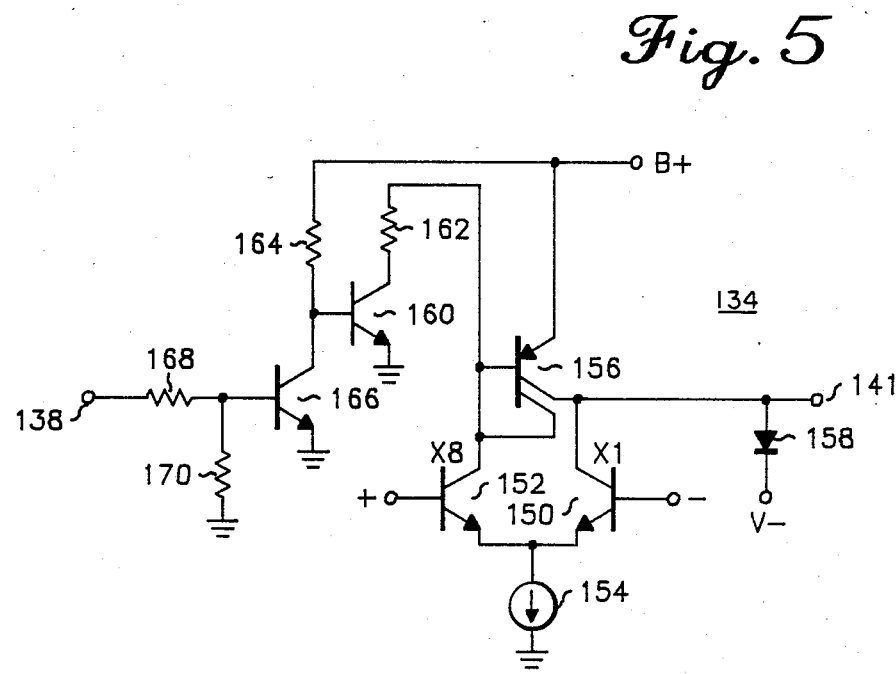
FIG. 5 shows a more detailed schematic of transconductance amplifier 134 utilized in FIG. 4.
Figure 6:
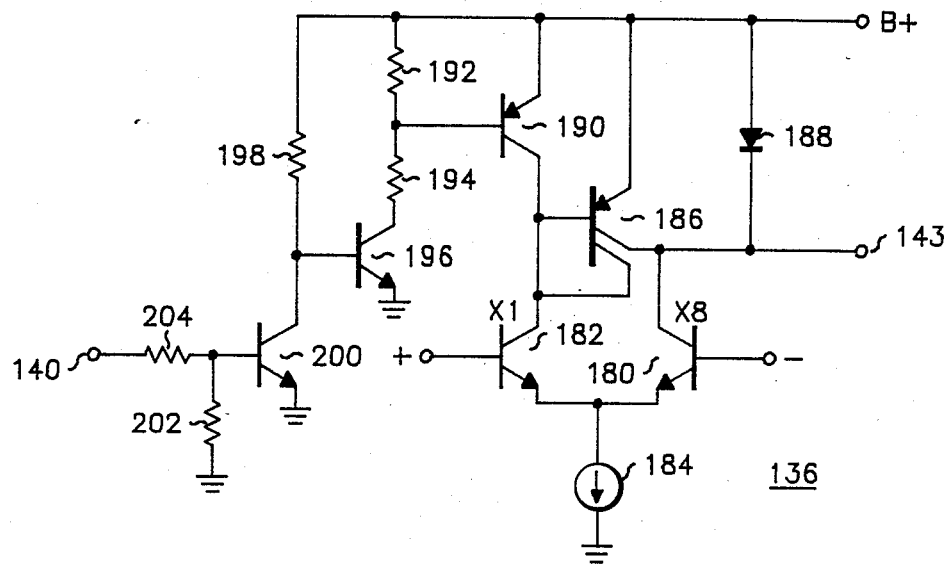
FIG. 6 shows a more detailed schematic of transconductance amplifier 136 of FIG. 4.

Turning now to FIG. 5, a preferred configuration of transconductance amplifier 134 is shown to include NPN transistors 150 and 152 having their emitters coupled together to form a differential amplifier configuration. The junction of their emitters is coupled through a current source 154 to ground. The base of transistor 150 forms the inverting input of amplifier 134 while the base of transistor 152 forms the non-inverting input of amplifier 134. The ratio of the area of the emitters of transistors 152 and 150 are scaled at a ratio of 8 to 1 as shown with the emitter of transistor 152 having 8 times the area of transistor 150 in order to achieve the desired 54 millivolts of offset voltage. By adjusting this ratio, the offset voltage may be changed to match the peak output of the FM detector. As it is well known in the art, every time the ratio is doubled an additional 18 millivolts of offset is attained.

A PNP transistor 156 having two collectors has a first of the collectors coupled back to its base and coupled to the collector of transistor 152. The second collector is coupled to the collector of transistor 150 and this junction forms the amplifiers' output 141. The emitter of transistor 156 is coupled to B+. The connection of transistor 156 forms a current mirror supplying current to transistor 150. Diode 158 is coupled between node 141 and V− with its anode connected to node 141 in order to prevent amplifier 134 from saturating.

Transistors 150, 152, 156, and current source 154 form the heart of amplifier 134. An NPN transistor 160 has its collector coupled through a resistor 162 to the base of transistor 156. The emitter of transistor 160 is grounded. The base of transistor 160 is normally pulled toward B+ by resistor 164. An NPN transistor 166 has its emitter coupled to ground and its collector coupled to the base of transistor 160. The base of transistor 166 is coupled to ground through a resistor 170 and to node 138 through a resistor 168. Transistors 160 and 166 along with their associated resistors are utilized to effect turn-off of amplifier 134. When the amplifier is turned ON a logic high level is applied to node 138. This turns transistor 166 ON cutting off transistor 160 which allows the base of transistor 156 to be driven by the collector of transistor 152.

When a low logic level is applied to input 138, transistor 166 is turned OFF allowing transistor 160 to be turned ON. By appropriately choosing resistor 162 to draw more current than current source 154 supplies, transistor 160 is able to effectively disable amplifier 134 by forcing the current from the second collector of transistor 156 to always exceed the current from the collector of transistor 150 regardless of the input voltage conditions. This forces the output of amplifier 134 to the high state when the amplifier is turned OFF. In the preferred embodiment, current source 154 sources approximately 10 microamps of current but this is not to be limiting.

Turning now to FIG. 6, a detailed schematic of a preferred transconductance amplifer suitable for use as amplifier 136 is shown. Amplifier 136 includes a pair of transistors 180 and 182, both NPN, which have their emitters connected to form a differential amplifer. The emitters are coupled through current source 184 to ground. In this amplifer the emitter areas of transistors 180 to 182 are at a ratio of 8 to 1 (that is, the emitter of transistor 180 is larger). The base of transistor 180 forms the inverting input of the amplifier, while the base of transistor 182 forms the non-inverting input of the amplifier. A PNP transistor 186 has two collectors, one of which is coupled back to its base and in turn coupled to the collector of transistor 182. The second collector is coupled to the collector of transistor 180 and forms output node 143. The emitter of transistor 186 is coupled to B+. A diode 188 is coupled between B+ and output node 141 with its anode towards B+ in order to prevent output saturation. These components form the heart of transconductance amplifier 136.

A PNP transistor 190 has its emitter coupled to B+ and its collector to the base of transistor 186. The base of transistor 190 is coupled through a resistor 192 to B+. The base of transistor 190 is driven through resistor 194 by the collector of transistor 196. The emitter of transistor 196 is coupled to ground and the base of transistor 196 is normally pulled high through a resistor 198. The base of transistor 196 is driven by the collector of a transistor 200. The emitter of transistor 200 is connected to ground and the base is normally pulled low to ground through a resistor 202. The base is driven by node 140 through a resistor 204.

In normal operation, a logic high is applied to node 140 in order to enable amplifier 136. This turns on transistor 200 which in turn turns off transistor 196 thereby turning off transistor 190. When a logic low appears at node 140 transistor 200 is turned off which allows transistor 196 to be turned on which turns on transistor 190 shorting the base of transistor 186 to B+. Resistors 192 and 194 should be selected so that transistor 190 can source more current than current source 184 can sink (preferably about 10 μA). This effectively disables amplifier 136 by forcing its output to a low state. It is clear that many other possible configurations are suitable for amplifier 134 and 136.

Thus it is apparent that in accordance with the present invention, an apparatus that fully satisfies the objectives, aims and advantages is set forth above. While the invention has been described in conjunction with specific embodiments, it is evident that many alternatives, modifications and variations will become apparent to those skilled in the art in light of the foregoing description. Accordingly, it is intended that the present invention embrace all such alternatives, modifications and variations as fall within the spirit and broad scope of the appended claims.

What is claimed is:

1. A signal processing arrangement having an input and a reference voltage, said signal processing arrangement for use with a signal, said signal being capacitively coupled to said input, said signal processing arrangement comprising in combination:
    first voltage comparing means for comparing an input signal at said input with said reference voltage and for providing a first output signal when said input signal exceeds said reference voltage by a first predetermined voltage;
    first voltage clamping means, coupled to said input, for preventing said input signal from exceeding said reference voltage by more than said first predetermined voltage;
    second voltage comparing means for comparing said input signal with said reference voltage and provding a second output signal when said input signal decreases below said reference voltage by a second predetermined voltage; and
    second voltage clamping means, coupled to said input, for preventing said input voltage from decreasing below said reference voltage by more than said second predetermined voltage.

2. The signal processing arrangement of claim 1, wherein said first and second voltage comparing means are selectively actuable; whereby, said first and second voltage clamping means are not responsive to changes in said input voltage when said first and second voltage comparing means are not actuated.

3. The signal processing arrangement of claim 1, wherein said first and second voltage clamping means include first and second transistors, respectively, coupled to first and second bias voltages, respectively.

4. The signal processing arrangement of claim 1, wherein said first and second voltage comparing means include first and second differential transconductance amplifiers, respectively.

5. The signal processing arrangement of claim 4, wherein said first and second transconductance amplifiers are selectively actuable.

6. The signal processing arrangement of claim 5, further including control means for selectively actuating said first and second transconductance amplifiers.

7. The signal processing arrangement of claim 4, wherein said first and second transconductance amplifiers include offset means for requiring a predetermined offset voltage to occur between their differential inputs in order to cause a change in output.

8. The signal processing arrangement of claim 7, wherein said offset means includes a differential pair of transistors having an emitter area ratio which is selected to determine said predetermined offset voltage, whereby said predetermined offset voltage is said first and second predetermined voltage.

9. The signal processing arrangement of claim 8, wherein said first and second transconductance amplifiers are selectively actuable.

10. The signal processing arrangement of claim 2, further including control means for selectively actuating said first and second voltage comparing means.

11. The signal processing arrangement of claim 2, further including:
    a source for providing said input signals;
    a capacitor coupling said signals to said input; and
    battery saver means for selectively applying power to said source to effect conservation of battery power.

12. The signal processing arrangement of claim 11, wherein said battery saver means applies power to said source for a predetermined interval periodically, and wherein said battery saver means further includes control means for selectively actuating said first and second voltage comparing means for a predetermined time period at the beginning of each of said predetermined intervals.

13. The signal processing arrangement of claim 1, wherein said first and second predetermined voltages are approximately equal.

14. The signal processing arrangement of claim 1, wherein the peak-to-peak voltage of said input signal is less than or equal to the sum of said first and second predetermined voltages.

15. The signal processing arrangement of claim 1, wherein said signal processor includes a limiter, connected to said input, for limiting said input signal.

* * * * *